(12) United States Patent
Wong et al.

(10) Patent No.: US 6,614,317 B2
(45) Date of Patent: Sep. 2, 2003

(54) VARIABLE LOCK WINDOW FOR A PHASE LOCKED LOOP

(75) Inventors: Keng L. Wong, Portland, OR (US); Usman Azeez Mughal, Hillsboro, OR (US); Masud Kamal, Pflugerville, TX (US); Chee How Lim, Hillsboro, OR (US); Kent R. Callahan, Hillsboro, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 09/865,299

(22) Filed: May 24, 2001

(65) Prior Publication Data

US 2002/0175769 A1 Nov. 28, 2002

(51) Int. Cl.[7] ................................................. H03L 7/00
(52) U.S. Cl. .................... 331/17; 331/DIG. 2; 331/1 A; 327/156; 375/376
(58) Field of Search .......................... 331/DIG. 2, 1 A, 331/17; 327/156; 375/376

(56) References Cited

U.S. PATENT DOCUMENTS 5,724,007 A * 3/1998 Mar .............................. 331/1 A
6,211,742 B1 * 4/2001 Tan et al. ....................... 331/25

* cited by examiner

Primary Examiner—Arnold Kinkead
(74) Attorney, Agent, or Firm—Fish & Richardson P.C.

(57) ABSTRACT

A lock detector system which operates adaptively based on a frequency of operation. Different lock windows are defined for different frequencies of operation and are automatically formed based on the controlled signal that is used to drive the voltage controlled oscillator of the phase locked loop.

32 Claims, 4 Drawing Sheets

VARIABLE LOCK WINDOW FOR A PHASE LOCKED LOOP

BACKGROUND

Processing chips, such as microprocessors, often operate at a relatively high frequency. The frequency may range into the GHz range, and future generations of processors may operate even faster. The processor's operation is stabilized by a stabilized clock source. The clock source may use a phase locked loop ("PLL").

Processor designs may be relatively complex, and may need debugging during that design phase. It may be difficult to debug a processor at higher frequencies (1 GHz and above) due to lack of high speed measurement systems. Therefore such debugging often starts at lower frequencies and then is debugged at higher frequencies.

Low power processing has also forced the same PLLs to operate at much lower frequencies during battery operated mobile modes versus desktop modes. It may be difficult to allow the same PLL to operate at two extreme frequency corners without losing lock.

BRIEF DESCRIPTION OF THE DRAWINGS

These and other aspects will now be described in detail with reference to the accompanying drawings, wherein.

DETAILED DESCRIPTION

A conventional lock detector circuit may define a lock window. As long as the up and down signals generated by the phase detectors have a width smaller than the lock window, the associated PLL is indicated as locked.

The present embodiment recognizes that different frequencies of operation in computation-intensive circuits such as processor circuits may change the necessary characteristics of operation. For example, the relationship between clock jitter and frequency may change depending on the frequency of operation. At lower frequencies, more clock jitter may be acceptable. In addition, when a phase locked loop is used, one component of that phase locked loop may include a voltage controlled oscillator. This voltage controlled oscillator may also have process, voltage temperature (PVT) dependencies due to differences in transistor sizes and circuit topologies.

The embodiments disclosed in this disclosure defines a frequency dependent lock window. The circuit which defines this lock window uses elements that have a specified matching relationship to the corresponding elements in the voltage controlled oscillator circuit. As such, the circuit tracks the dependencies of the voltage controlled oscillator and specifically its process, voltage temperature dependencies. This new lock detector uses the external clock ("xclk") and feedback clock ("fbclk") as reference signals to determine an indication of a locked PLL.

In an embodiment, the current that forms the controls the lock detector may be controlled by the charge pump voltage Vcntl from the phase locked loop.

This lock detector circuit and technique may allow a tight lock window at high frequencies, and a less tight, or 'wider', lock window at lower frequencies. This may indicate the phase locked loop to remain locked at lower and higher frequencies.

Figure 1:
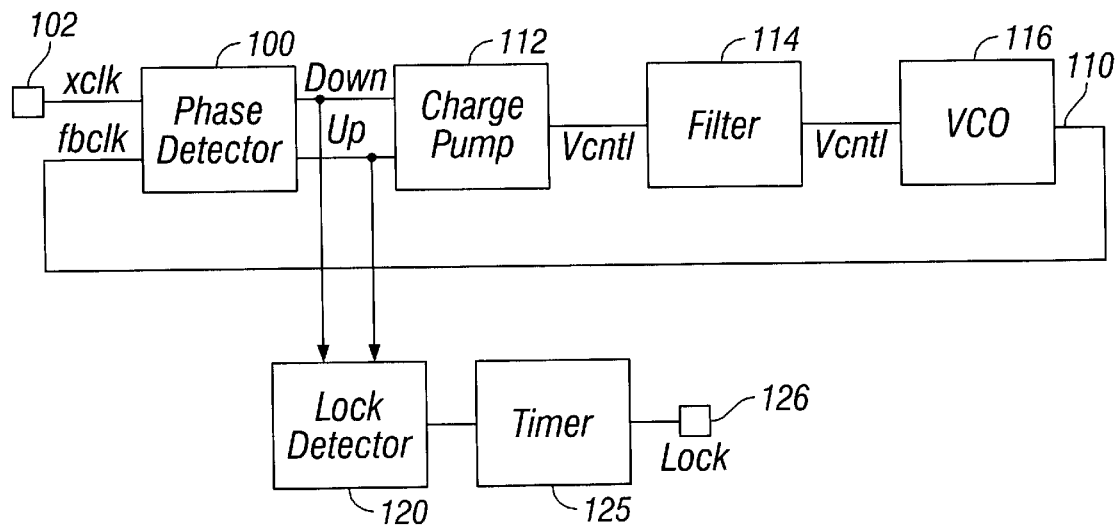
FIG. 1 shows a block diagram of a phase locked loop with a lock detector of an embodiment.

A basic phase locked loop system is shown in FIG. 1. A phase detector 100 detects the phase difference between the external clock input (xclk) 102 which can be from a crystal, for example, and a feedback clock signal (fbclk) 110. The phase detector produces up and down signals indicative of the phase difference between the input signals 102, 110. The up and down signals control the charge pump and hence the VCO frequency. The up and down signals may also detect whether the phase locked loop is in its locked condition.

The lock detection is carried out by the up and down signals driving a lock detector 120 which drives a timer 125 that produces the lock signal 126. If the up and down pulses become smaller than a certain defined lock window width, e.g., x ps, then the lock detector 120 de-asserts the reset signal to the counter 125. The counter 125 begins counting. When the count reaches a specified value, a locked condition is established. However, if the lock detector detects up and down pulses with greater than x ps pulse width, then the lock timer 125 is reset, causing the output 126 to flag an unlock signal. The unlock signal may prevent certain systems from operating.

If the phase difference between the xclk and fbclk is small, then the PLL is considered as locked, and operation is allowed to continue. However, the allowable phase difference is usually based on the usual operating frequency of the processor. Hence, this phase difference may include the allowable phase difference when the processor is operating at this very high frequency e.g. 1 Ghz and above.

At a lower frequency, a greater amount of phase difference may still occur, with the PLL still remaining locked. The lock detector, however, may erroneously indicate that this is not an acceptable difference, and may signify that the PLL is unlocked.

The phase detector's up and down signals also respectively drive a charge pump 112 to produce a control voltage (Vcntl) based on the up and down signals. This control voltage is also filtered by filter 114 which drives a voltage controlled oscillator 116 whose output signal 110 represents the produced clock.

The lock detector 120 may be formed using any technique which has been known in the art. According to one embodiment disclosed herein, that same control voltage is also used to set a size of a lock window.

Figure 2:
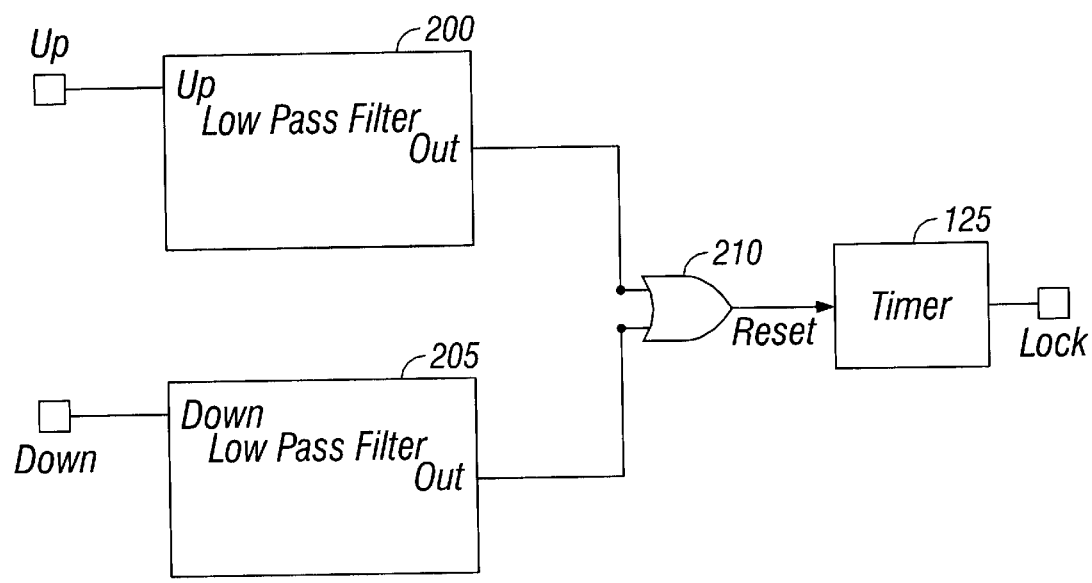
FIG. 2 shows a block diagram of a first lock detector circuit.

FIG. 2 shows an example which is a lock detector based on low pass filters. The low pass filter 200 receives the up signal, with the low pass filter 205 receives the down signal. The output of the low pass filter is effectively an averaged version of the signal. The two outputs from the low pass filters are Or ed at 210, to form the reset to the timer/counter 125.

Figure 3:
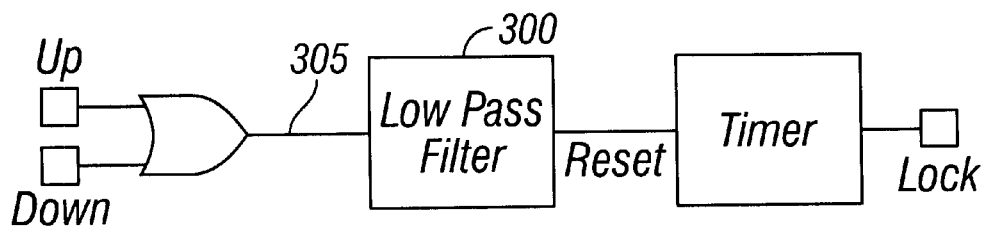
FIG. 3 shows a block diagram of a second lock detector circuit.

An alternative system, shown in FIG. 3, uses a single low pass filter 300 which is driven by the OR'ed version 305 of the up and down signal. While only these two specific systems are disclosed herein, it should be understood that other lock detector systems may also be used.

Consider what happens when the clock jitter to PLL frequency ratio is 100 ps:500 ps at a high frequency for a locked PLL. Consider the low pass filter (LPF)lock window to be 100 ps. Then at half that frequency, the PLL will be locked with its clock jitter to PLL frequency ratio of 100 ps:1000 ps. In this case, at low frequency (1000 ps), the clock jitter to PLL frequency ratio becomes half as large as that of the ratio at high-frequency. This results in a tighter locking specification than is really necessary; in other words, the circuit becomes unlocked more easily than is really needed. This in turn may result in the lock detector signaling an unlocking condition, when everything is really working properly. This unlocking condition is caused by the low jitter tolerance rather than circuit conditions.

The present application recognizes that prior art lock detection circuits operate as expected at the relatively higher frequencies. At the lower frequencies, erroneous unlock detections may unintentionally reset the PLL timer circuit and other critical circuits. It should also be understood that the opposite scenario can occur.

The present invention discloses a circuit and a technique that addresses these problems. The circuit may include many advantages including a frequency dependant lock window which is formed by using the VCO's control signal to change the lock window; e.g., to widen the lock window as the VCO frequency is decreased. The additional circuit includes a bias circuit that uses transistor sizes that are integer multiples of transistor sizes of the VCO circuit elements. By using such a circuit topology, the VCO behavior may be able to track across process, voltage temperature variations better than other systems. This circuit may also have a more constant clock jitter to VCO frequency ratio, to make a more tailored lock detection tolerance. The circuit defines a wider lock window at lower frequencies. At higher frequencies, the system defines a narrower lock window. This may avoid the false detection of an unlock condition when the system is operating in a lower frequency mode.

Figure 4:
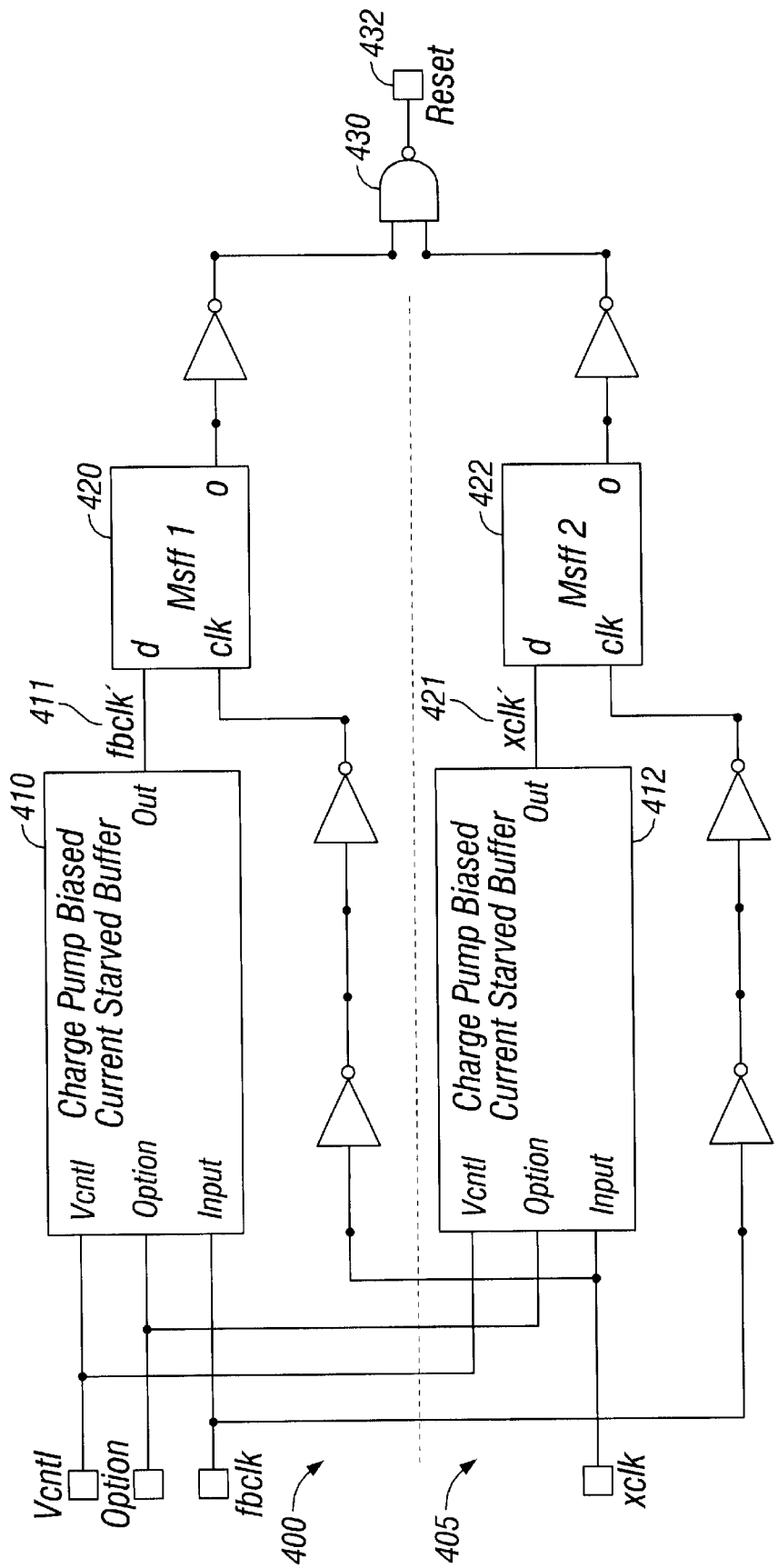
FIG. 4 shows a circuit of self-biased lock detector according to an embodiment.

The circuit of the embodiment is referred to herein as a self-biased locked detector circuit. The detector circuit may include both analog and digital parts. A block diagram of the circuit is shown in FIG. 4. The circuit basically includes two parts 400 and 405 which each compare the input clock xclk with the feedback clock fbclk. The upper part 400 detects when xclk is leading fbclk by a specified amount. The lower part 405, in contrast, detects when xclk is lagging fbclk by the specified amount. When either is detected, the output becomes active, and causes a reset indicating an unlock condition.

Figure 6:
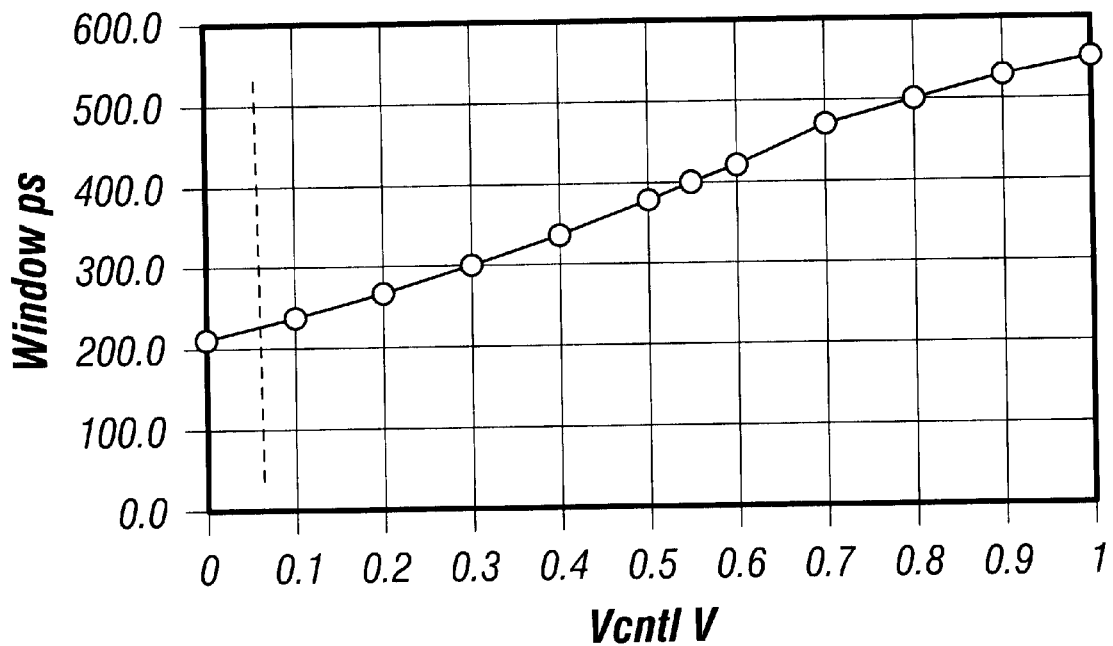
FIG. 6 shows a diagram of a lock window.

The value of the signal generated by the charge pump and low pass filter combination controls the VCO frequency. This charge pump is controlled by a phase difference between external clock and feedback clock. The time difference between the feedback clock and external clock when reset (FIG. 4) goes high is called the lock window. The lock window is shown in FIG. 6. This lock window is frequency dependent; as the charge pump output voltage increases, the frequency decreases. Hence, this results in a relatively wider lock window at lower frequencies.

Figure 5:
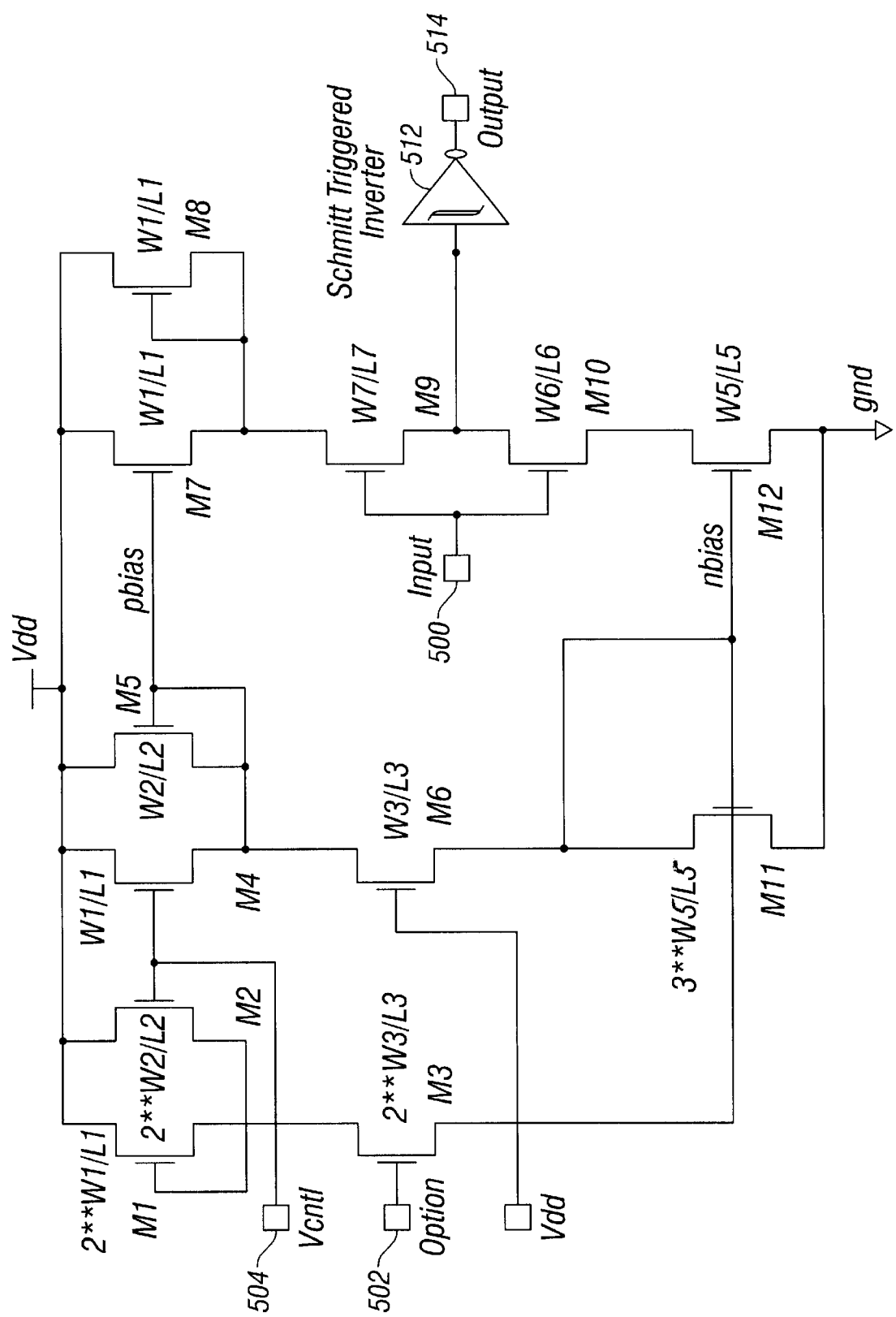
FIG. 5 shows a transistor level diagram of the analog portion of the circuit of FIG. 4.

The circuits 410 and 412 form the analog portion of the circuit as shown in FIG. 5. This may include a current mirror based biasing circuit.

In operation, the input value 500 corresponds to the fbclk in the upper circuit 400, and the xclk in the lower circuit 405. In both cases, the circuit produces a delayed version of the clock that is delayed based on the level of Vcntl. In the upper circuit 400, the delayed version of the feedback clock is shown as fbclk' 411. In the lower circuit 405, the delayed version of the input clock is shown as xclk' 421. The delayed version of the clock 411/421 is applied as input to one of the flip-flops 420, 422.

Taking the upper circuit 400 as exemplary, the buffer circuit 400 receives the feedback clock fbclk as an input, and produces a delayed version fbclk' of the feedback clock as an output. The amount of delay is dependent on the voltage control input Vcntl to the circuit 410.

The digital portion of the lock detector may include phase detectors 420,422 implemented as master slave flip-flops. These phase detectors compare the phase of the external clock xclk with the feedback clock fclk.

The upper portion 400 compares a delayed version of the feedback clock fbclk', with reference to the rising edge of the external clock xclk. The lower half circuit 405 compares a delayed version of the external clock xclk' with reference to the feedback clock fbclk. The outputs of both of the latches are then compared in NAND gate 430. This comparison effectively determines the time between the external clock and the feedback clock.

The flip-flop 420 receives the input clock xclk as the clock input. It receives the delayed feedback clock fbclk' at its D input. If the feedback clock is present at the active edge of the input clock xclk, then the jitter or difference between the two clocks is established as being beyond the lock window, which causes flip-flop 422 to produce an output, which causes a reset on the reset line 432. Again, the output of the flip-flop 420 is dependent on how much delay is entered into the fbclk' signal. More delay allows the circuit to tolerate wider lock windows before establishing an unlock condition.

The bottom circuit 405 operates in an analogous way; however, it delays the input clock xclk and compares that delayed input clock with the feedback clock.

The charge pump output Vcntl sets the allowable amount of delay. As the VCO frequency increases, Vcntl decreases, for this type of self-biased PLL, and this correspondingly increases the current through M4, M5 and M6, and also through M1, M2 and M3. In other more traditional kinds of PLLs, there may be a linear relationship of Vcntl and VCO frequency. In that case the lock detector circuit is designed to have a lock window that will widen as Vcntl goes down and become narrow when Vcntl value goes up.) This increased current lowers the P bias voltage, which hence causes M7 to turn on faster. This causes current through the current starved inverter to rise. Eventually, the current through the inverter gets high enough to trigger the Schmitt triggered inverter 512 faster, and results in a narrower lock window. Hence, as the voltage Vcntl decreases, the VCO operates faster. As the voltage Vcntl increases, the VCO operates slower.

The entire operation is mirrored in the bottom half of the circuit, thus also causing an analogous but mirrored operation to the n bias that controls transistor M12.

Voltage temperature and process changes may also cause errors in the operation of the circuit. The FIG. 5 transistors show width to length ratios between the different transistors. In this embodiment, the transistors M1, M2, M3, M4, M5 and M6 are copies of the corresponding components in the VCO 116. These components receive the same control voltage, Vcntl that controls from the VCO. By matching the components to similar components in the VCO, we have a lock detection system that tracks with VCO across PVT. For example, the transistors M1, M2 and M3 are each matched with 2.W/L to match corresponding circuits in the VCO. The other transistors M4, M5, and M6 follow the relation 1.W/L.

FIG. 6 shows the frequency dependent lock windows, and how as Vcntl increases, the frequency may decrease, and the lock window may widen.

Other operations are also possible. An option input 502 allows turning off the M3 transistor, thereby turning off the entire left branch of the circuit. This leaves only and 4, and 5 and and 6 operating. By doing so, this allows the lock window to be changed manually by some factor.

Although only a few embodiments have been disclosed in detail above, other modifications are possible.

What is claimed is:

1. A circuit, comprising:
   a phase locked loop, detecting and maintaining a phase relationship between an input clock signal and a feedback clock signal;
   a lock detector, detecting whether said feedback clock signal agrees with said input clock signal within an amount of a lock window; and
   a lock window varying element, operating to vary a size of the lock window depending on a frequency of operation of said phase locked loop, wherein said lock window varying element makes the lock window wider at lower frequencies.

2. A circuit as in claim 1, wherein said lock window varying element includes a timing circuit driven by a signal from said phase locked loop which is indicative of the frequency of said phase locked loop said timing circuit producing a signal indicating the size of the lock window.

3. A circuit as in claim 3, wherein said timing circuit includes a delay circuit which receives one of said clock signals, and said signal indicating the size of the lock window to produce a delayed version of said one of said clock signals, and which compares an other clock signal, different than said one clock signal, with said delayed version of said one clock signal, where an amount of delay sets an allowable lock window.

4. A circuit as in claim 3, wherein said timing circuit includes a first delay circuit which compares the input clock signal with a delayed version of the feedback clock signal, and a second delay circuit which compares the feedback clock signal with a delayed version of the input clock signal.

5. A circuit as in claim 2, further comprising an option input, a level of which further changes a size of said lock window by a specified factor.

6. A circuit as in claim 1, wherein said lock detector includes first and second circuit parts, including a first circuit part which detects whether the input clock signal leads the feedback clock signal, and a second circuit part which detects whether the feedback clock signal leads the input clock signal.

7. A circuit as in claim 6, wherein said lock window varying element includes a timing circuit, driven by a signal from said phase locked loop which is indicative of the frequency of said phase locked loop, said timing circuit producing a signal indicating the size of the lock window, and wherein said first and second parts are each responsive to the signal indicative of a size of the lock window.

8. A circuit as in claim 7, wherein each of said first and second parts delay one of said clocks signals based on said signal indicative of said size of the lock window.

9. A circuit as in claim 8, further comprising a current starved inverter, which is biased by said signal indicative of said size of the lock window, and driven by a clock signal, wherein an amount of delay depends on a magnitude of bias.

10. A method, comprising:
    operating a processor at a first faster speed of operation, and maintaining a phase locked loop with a first lock window at said first, faster speed of operation; and
    testing said processor at a second, slower speed of operation and maintaining said phase locked loop with a second lock window at said second slower speed of operation, said second lock window being wider than said first lock window.

11. A method as in claim 10, further comprising using a control signal for said phase locked loop to control a size of said first and second lock windows.

12. A method as in claim 11, wherein said phase locked loop includes an input clock, and a feedback clock, and said control signal is used to delay each of said input clock and said feedback clock to determine an amount of an allowable clock jitter.

13. A method as in claim 11, further comprising using an option signal to change a size of a lock window by a fixed factor.

14. A method as in claim 11, further comprising scaling transistors which control the size of said first and second windows, to match transistors of a specified part of said phase locked loop.

15. A method, comprising:
    operating a first device according to a clock signal;
    detecting when said clock signal varies from a reference clock signal by more than a specified lock window amount; and
    varying said specified lock window amount based on a frequency of operation of said first device, wherein said varying comprises making the lock window amount wider at lower frequencies.

16. A method as in claim 15, wherein said varying comprises using a control signal related to a frequency of operation, to vary said specified lock window amount.

17. A method as in claim 16, wherein said using said control signal comprises using said control signal to delay one of said clock signals relative to an other to form a delayed clock signal, and further comprising determining if a specified clock signal arrives prior to said delayed clock signal.

18. A method as in claim 15, further comprising tracking to process, voltage, and temperature variation.

19. An apparatus, comprising:
    a phase detector, detecting a phase difference between an input clock and a feedback clock, and producing a control signal indicative thereof; wherein the control signal comprises a measure of a frequency of operation of the apparatus;
    a lock window forming circuit, responsive to said control signal, to form a lock window wider at lower frequencies based on a magnitude of said control signal; and
    a lock detector circuit, responsive to said lock window, and operating to detect if said phase difference exceeds an amount allowed by said lock window.

20. An apparatus as in claim 19, further comprising a voltage controlled oscillator, producing an oscillation frequency based on said control signal.

21. An apparatus as in claim 20, wherein said lock detector circuit has transistor sizes which mimic corresponding transistors sizes in said voltage controlled oscillator.

22. An apparatus as in claim 21, wherein said transistor sizes have specified size ratios which are the same as specified size ratios in said voltage controlled oscillator.

23. An apparatus as in claim 22, further comprising a window option controller, having first and second states, and adjusting a size of said window by a factor based on whether said window option controller is in said first or said second state.

24. An apparatus, comprising:
    a lock window forming circuit, receiving a control signal indicative of a frequency of operation, and also receiving a feedback clock and an external clock, operating to delay one of said clocks relative to the other of said clocks by an amount based on said control signal to form a delayed clock, and to compare said delayed clock with said other of said clocks, and establish an unlock condition when a first relationship exists between said delayed clock and said other of said clocks, wherein said lock window forming circuit makes the lock window wider at lower frequencies.

25. An apparatus as in claim 24, wherein said one of said clocks is the feedback clock.

26. An apparatus as in claim 24, wherein said one of said clocks is the external clock.

27. An apparatus as in claim 24, further comprising a voltage controlled oscillator, producing an output frequency, and wherein said control signal also controls said voltage controlled oscillator.

28. An apparatus as in claim 27, further comprising a phase detector, detecting a phase between an output of said voltage controlled oscillator, and said external clock, and producing said control signal based on said phase difference.

29. An apparatus, comprising:

a first circuit, receiving a control signal, and also receiving a feedback clock and an external clock, and delaying said feedback clock by an amount based on said control signal to form a delayed feedback clock, and comparing said external clock to said delayed feedback clock and establishing an unlock condition based on a first relationship between said external clock and said delayed feedback clock;

a second circuit, receiving said control signal, and said feedback clock and said external clock, and delaying said external clock by an amount based on said control signal to form a delayed external clock, and comparing said feedback clock to said delayed external clock and establishing an unlocked condition based on a second relationship between said feedback clock and said delayed external clock, wherein establishing said unlocked condition based on the second relationship comprises establishing a wider lock window at lower frequencies; and a voltage controlled oscillator, also receiving said control signal, and producing a frequency that is based on said control signal.

30. An apparatus as in claim 29, further comprising a phase detector, detecting a difference between said frequency from said voltage controlled oscillator, and said external clock.

31. An apparatus as in claim 30, wherein said phase detector produces said control signal based on said difference.

32. An apparatus as in claim 30, wherein said voltage controlled oscillator includes a plurality of transistors having a same width to length ratio as a corresponding plurality of transistors in said first and second circuits.

\* \* \* \* \*